(12) United States Patent
Cheng et al.

(10) Patent No.: US 12,331,392 B2
(45) Date of Patent: Jun. 17, 2025

(54) DEPOSITION SYSTEM AND METHOD

(71) Applicant: Taiwan Semiconductor Manufacturing Co., Ltd., Hsinchu (TW)

(72) Inventors: Wen-Hao Cheng, Hsinchu (TW); Hsuan-Chih Chu, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,911

(22) Filed: Aug. 10, 2023

(65) Prior Publication Data

US 2023/0383400 A1 Nov. 30, 2023

Related U.S. Application Data

(62) Division of application No. 17/384,310, filed on Jul. 23, 2021, now Pat. No. 11,851,751.

(51) Int. Cl.
*C23C 14/56* (2006.01)
*B08B 5/02* (2006.01)
*B08B 7/02* (2006.01)
*B08B 7/04* (2006.01)
*B08B 9/00* (2006.01)
(Continued)

(52) U.S. Cl.
CPC .............. *C23C 14/564* (2013.01); *B08B 5/02* (2013.01); *B08B 7/028* (2013.01); *B08B 7/04* (2013.01); *B08B 9/00* (2013.01); *B08B 13/00* (2013.01); *C23C 14/34* (2013.01); *C23C 14/50* (2013.01); *B08B 2209/005* (2013.01)

(58) Field of Classification Search
CPC ....... C23C 14/564; C23C 14/34; C23C 14/50; B08B 5/02; B08B 7/028; B08B 7/04; B08B 9/00; B08B 13/00; B08B 2209/005
See application file for complete search history.

(56) References Cited

U.S. PATENT DOCUMENTS 3,627,569 A 12/1971 Beecham
5,330,628 A 7/1994 Demaray et al.
(Continued)

FOREIGN PATENT DOCUMENTS

CN 102301451 A 12/2011
CN 105887026 A 8/2016
(Continued)

OTHER PUBLICATIONS

JP-06330309-A Translation (Year: 1994).*

*Primary Examiner* — James Lin
*Assistant Examiner* — Patrick S Ott
(74) *Attorney, Agent, or Firm* — Seed IP Law Group

(57) ABSTRACT

A deposition system is provided capable of cleaning itself by removing a target material deposited on a surface of a collimator. The deposition system in accordance with the present disclosure includes a substrate process chamber. The deposition includes a substrate pedestal in the substrate process chamber, the substrate pedestal configured to support a substrate, a target enclosing the substrate process chamber, and a collimator having a plurality of hollow structures disposed between the target and the substrate, a vibration generating unit, and cleaning gas outlet.

20 Claims, 9 Drawing Sheets

(51) Int. Cl.
*B08B 13/00* (2006.01)
*C23C 14/34* (2006.01)
*C23C 14/50* (2006.01)

(56) References Cited

U.S. PATENT DOCUMENTS

| | | | |
|---|---|---|---|
| 5,346,601 A | 9/1994 | Barada et al. | |
| 5,409,587 A | 4/1995 | Sandhu et al. | |
| 5,478,455 A | 12/1995 | Actor et al. | |
| 5,648,428 A | 7/1997 | Krivokapic et al. | |
| 6,197,699 B1 * | 3/2001 | Fritzinger | H01J 37/32862 |
| | | | 438/711 |
| 6,436,246 B1 | 8/2002 | Sandhu | |
| 6,592,728 B1 | 7/2003 | Paranjpe et al. | |
| 7,245,804 B2 | 7/2007 | Teramura et al. | |
| 9,062,372 B2 | 6/2015 | Gopalraja et al. | |
| 10,777,395 B2 | 9/2020 | Takeuchi et al. | |
| 11,823,964 B2 | 11/2023 | Cheng et al. | |
| 2002/0027429 A1 * | 3/2002 | Sandhu | C23C 14/046 |
| | | | 216/61 |
| 2005/0006223 A1 | 1/2005 | Nichols et al. | |
| 2005/0136691 A1 | 6/2005 | Le et al. | |
| 2006/0235563 A1 | 10/2006 | Parikh et al. | |
| 2009/0159104 A1 * | 6/2009 | Huang | C23C 16/4405 |
| | | | 134/1.1 |
| 2009/0308732 A1 | 12/2009 | Cao et al. | |
| 2011/0155561 A1 | 6/2011 | Otani et al. | |
| 2011/0272593 A1 * | 11/2011 | Graf | H01J 37/3002 |
| | | | 250/423 R |
| 2012/0234235 A1 | 9/2012 | Lee | |
| 2013/0264199 A1 | 10/2013 | Huang et al. | |
| 2014/0020629 A1 * | 1/2014 | Tsai | H01J 37/3447 |
| | | | 118/728 |
| 2016/0071700 A1 * | 3/2016 | Nozawa | H01J 37/32862 |
| | | | 134/1 |
| 2016/0370173 A1 | 12/2016 | Paul et al. | |
| 2017/0002467 A1 | 1/2017 | Straw et al. | |
| 2018/0067330 A1 | 3/2018 | Terada et al. | |
| 2019/0198299 A1 * | 6/2019 | Watanabe | H01L 21/67115 |
| 2019/0276926 A1 | 9/2019 | Lee et al. | |
| 2019/0287771 A1 | 9/2019 | Park et al. | |
| 2020/0024727 A1 | 1/2020 | Boruah et al. | |
| 2020/0185194 A1 | 6/2020 | Albarede et al. | |
| 2022/0081758 A1 | 3/2022 | Wang et al. | |
| 2022/0101526 A1 | 3/2022 | Lerch et al. | |
| 2022/0186357 A1 | 6/2022 | Park et al. | |
| 2022/0259720 A1 | 8/2022 | Bangalore Umesh et al. | |
| 2022/0336297 A1 | 10/2022 | Cheng et al. | |
| 2023/0022509 A1 | 1/2023 | Cheng et al. | |

FOREIGN PATENT DOCUMENTS

| | | | |
|---|---|---|---|
| CN | 108780742 A | | 11/2018 |
| CN | 109477208 A | | 3/2019 |
| CN | 110273135 A | | 9/2019 |
| CN | 112599401 A | | 4/2021 |
| JP | 06330309 A | * | 11/1994 |
| JP | H07316808 A | | 12/1995 |
| JP | 2019-196507 A | | 11/2019 |
| TW | 201732891 A | | 9/2017 |
| TW | 201900901 A | | 1/2019 |
| TW | 202014554 A | | 4/2020 |
| WO | 96/24155 A1 | | 8/1996 |

\* cited by examiner

DEPOSITION SYSTEM AND METHOD

BACKGROUND

To produce semiconductor devices, a semiconductor substrate, such as a silicon wafer, which is a raw material for the semiconductor devices, must go through a sequence of complicated and precise process steps such as diffusion, ion implantation, chemical vapor deposition, photolithography, etch, physical vapor deposition, chemical mechanical polishing, and electrochemical plating.

The physical vapor deposition (PVD) is generally used to deposit one or more layers (e.g., thin film) on the semiconductor substrate. For example, sputtering, a form of the PVD, is commonly used in the semiconductor fabrication process to deposit complex alloys and metals, such as silver, copper, brass, titanium, titanium nitride, silicon, silicon nitride, and carbon nitride, on the substrate. The sputtering includes a target (source), and a substrate (e.g., wafer) positioned in parallel to each other in a vacuum enclosure (e.g., process chamber). The target (cathode) is electrically grounded while the substrate (anode) has positive potential. Argon gas, which is relatively heavy and is a chemically inert gas, is commonly used as the sputtering ion species in the sputtering process. When the argon gas is introduced into the chamber, a plurality of collisions occurs with electrons released from the cathode. This causes the argon gas to lose its outer electrons and become positively charged argon ions. The positively charged argon ions are strongly attracted to the negative potential of the cathode target. When the positively charged argon ions strike the target surface, the momentum of the positively charged argon ions transfers to the target material to dislodge one or more atoms (target material) which eventually deposit on the substrate.

The target material atoms exiting the target are deposited on the substrate along various traveling paths.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
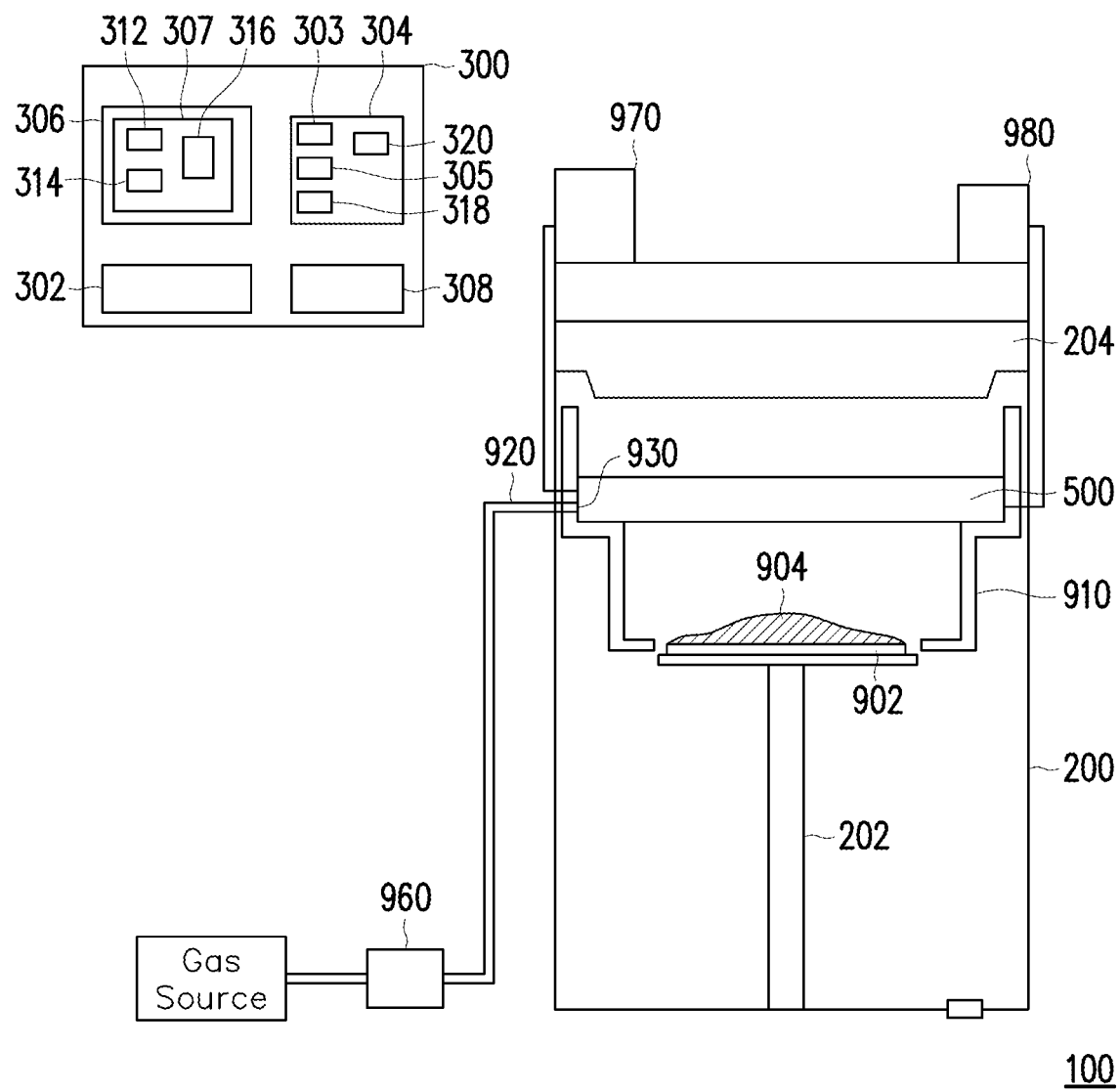
FIG. 1 is a sectional view of a substrate process chamber in a deposition system according to one or more embodiments in the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments in accordance with the subject matter described herein include a deposition system that is able to deposit a thin film (or a layer) on a substrate (e.g., contact or via structures on the wafer) with an enhanced gap-fill capability provided by a self-cleaning collimator (hereinafter "smart collimator"). The smart collimator according to one or more embodiments disclosed in the present disclosure is able to clean itself, by removing accumulated target material using methods such as applying vibration (e.g., ultrasonic vibration) and/or directing scrubbing gas (e.g., purging gas and cleaning gas) to the accumulated target material. The smart collimator according to one or more embodiments disclosed in the present disclosure includes a flux adjusting member that is able to adjust its dimension (e.g., length for each of adjustable hollow structures in the flux adjusting member) to increase cleaning effect from the vibration and/or scrubbing gas. The smart collimator according to one or more embodiments disclosed in the present disclosure includes the flux adjusting member that is able to adjust its dimension (e.g., length for each of adjustable hollow structures in the flux adjusting member) to deposit (or fill) the target material into gap patterns (such as steps and trenches) with various aspect ratios (e.g., high aspect ratio) on the substrate.

In addition, the smart collimator according to one or more embodiments disclosed in the present disclosure is able to provide a longer interval between the smart collimator changes due to the self-cleaning features. Moreover, the smart collimator according to one or more embodiments disclosed in the present disclosure is able to provide uniform deposition for all areas on the substrate by adjusting its dimension (e.g., length for each of adjustable hollow structures in the flux adjusting member). In various embodiments, the flux adjusting member is able to extend the lifetime of the target by adjusting its dimension (e.g., length for each of adjustable hollow structures in the flux adjusting member). In accordance with various embodiments of the present disclosure, the smart collimator, having a plurality of hollow structures, is positioned between the target and the substrate.

As discussed above, during the sputtering process, the positively charged argon ions strike the target surface, and the momentum of the positively charged argon ions transfers to the target material to dislodge one or more atoms therefrom, which are eventually deposited on the substrate along various traveling paths.

Embodiments of such a deposition system with the smart collimator can deposit (or fill) the target material into gaps (e.g., gap patterns) with a high aspect ratio on the substrate by capturing (or filtering) the target material that is likely to hinder the gap filling before arriving on the substrate based on the traveling path of the target material. For example, if the target material traveling to the gap is on a traveling path to the bottom surface of the gap (e.g., vertical direction), the gap is more likely filled with the material from the bottom surface of the gap. However, if the deposit material traveling to the gap is on a path directed to the side wall of the gap (e.g., inclined direction), the gap is more likely to be blocked by deposited target material at the top opening of the gap without having the target material filled all the way to the bottom of the gap. It is helpful to reduce the target material that is likely to block the gap, especially for the gap with a high aspect ratio, by having a plurality of narrow passages (e.g., hollow structures and adjustable hollow structures) between the target and the substrate.

In various embodiments, each of the adjustable hollow structures in the flux adjusting member included in the smart collimator is configured to extend individually or collectively to remove target material deposited on the smart collimator while the scrubbing gas (and/or vibration) is applied to the smart collimator. By extending the adjustable hollow structures, the cleaning effect from the vibration and/or scrubbing gas is increased as explained later in the present disclosure. In some embodiments, each of the adjustable hollow structures in the flux adjusting member included in the smart collimator is configured to extend and retract repeatedly for a predetermined duration to effectively remove the target material on the smart collimator.

In some embodiments, each of the adjustable hollow structures in the flux adjusting member included in the smart collimator is configured to extend individually or collectively to capture the target material that is likely to deposit on the side wall of the gap based on the aspect ratio of the gap (e.g., length for the adjustable hollow structures increases as the aspect ratio of the gap increases) to improve the gap-fill capability of the deposit system. In some embodiments of the present disclosure, by adjusting a respective length for each of the adjustable hollow structures individually or collectively, the deposit system is able to fill the gap with the high aspect ratio. In some embodiments of the present disclosure, by adjusting the respective length for each of the adjustable hollow structures in the flux adjusting member individually or collectively, the deposit system is able to deposit a uniform layer on the substrate. In some embodiments, by adjusting the respective length for each of the adjustable hollow structures in the adaptable collimator individually or collectively, the deposition system is able to stabilize a deposition rate for a longer time—extending the target lifetime.

FIG. 1 is a sectional view of a substrate process chamber 200 in a deposition system 100 according to one or more embodiments in the present disclosure.

Figure 2:
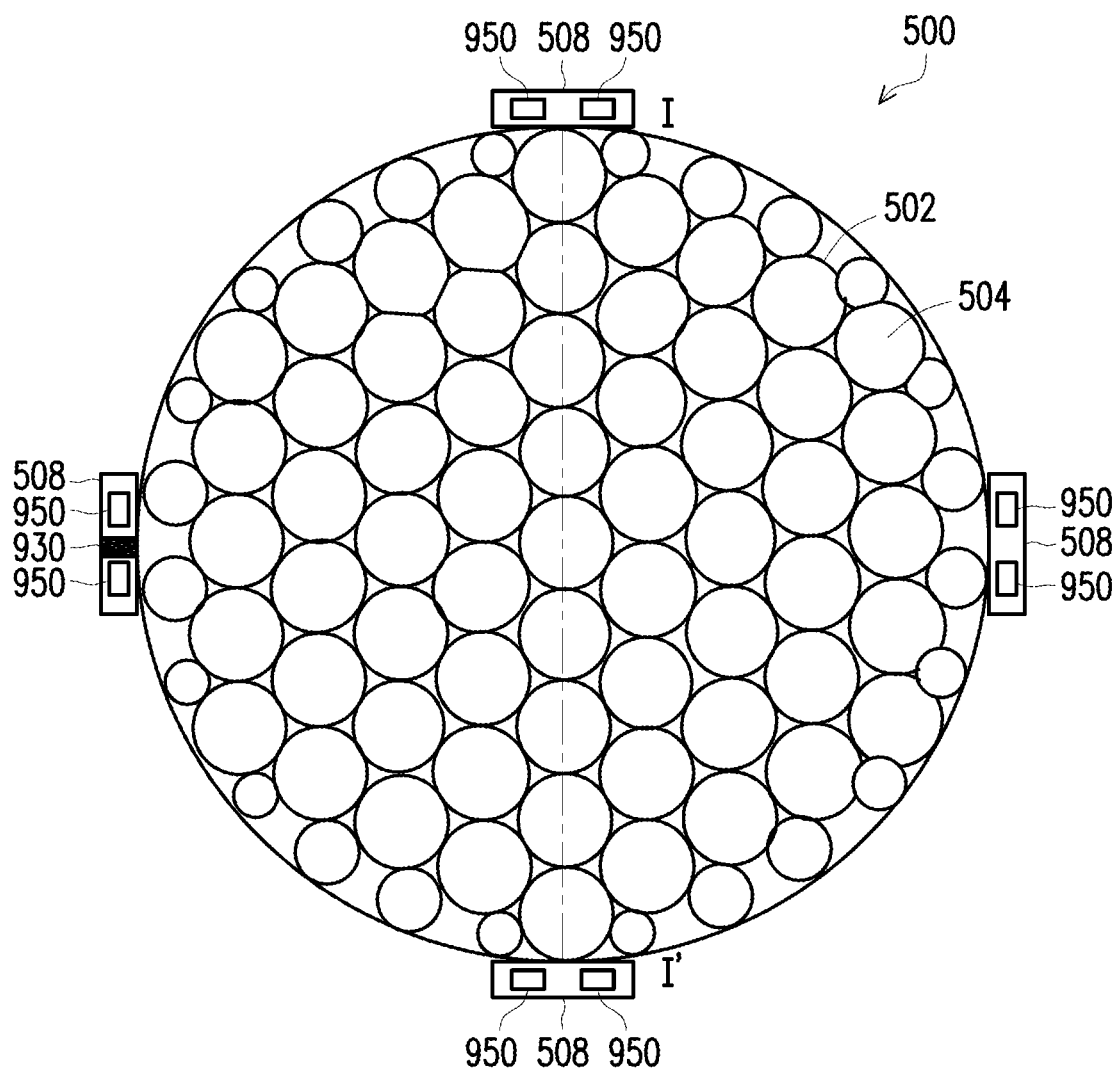
FIG. 2 is a top view of a collimator according to one or more embodiments in the present disclosure.
Figure 3:
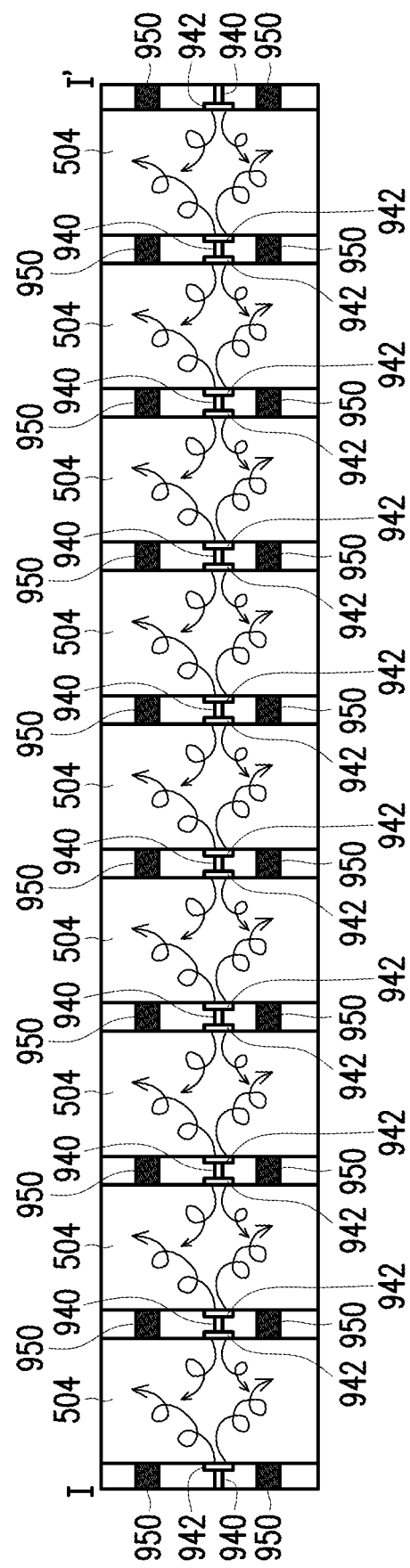
FIG. 3 is a cross-sectional view of the collimator according to one or more embodiments in the present disclosure.

Referring to FIG. 1, the substrate process chamber 200 includes a substrate pedestal 202 that supports a substrate 902 (e.g., wafer) in the substrate process chamber 200, a target 204 enclosing the substrate process chamber 200, a process shield 910 between the target 204 and substrate pedestal 202, a smart collimator 500 disposed in or near an inner side of the process shield 910 between the target 204 and the substrate pedestal 202, scrubbing gas supply line 920 to the smart collimator 500, a mass flow controller (MFC) 960 for controlling an amount of the scrubbing gas flowing into the scrubbing gas supply line 920, and a vibration driver 970 for controlling the ultrasonic vibration generating units 950 (shown in FIGS. 2 and 3).

FIG. 2 is a top view of a smart collimator 500 according to one or more embodiments in the present disclosure.

Referring to FIG. 2, the smart collimator 500 includes a scrubbing gas receiving port 930 (in FIG. 1), a plurality of hollow structures 502, (embedded) microchannels 940 for directing the scrubbing gas for cleaning the smart collimator 500 (shown in FIG. 3), and (embedded) ultrasonic vibration generating units 950 for cleaning the smart collimator 500 (shown in FIG. 3). In various embodiments of the present disclosure, the plurality of hollow structures 502 is clustered to provide a plurality of openings 504 where the material from the target 204 passes through. In some embodiments, each of the ultrasonic vibration generating units 950 is connected directly or indirectly with the vibration driver 970 which is configured to control the ultrasonic vibration generating units 950 based on a vibration control signal from a controller 300 in FIG. 1. In some embodiments of the present disclosure, the smart collimator 500 includes a flux adjusting member 700 (shown in FIGS. 5 and 6) and a flux adjusting member driver 980 in FIG. 1 that are used to control an amount of the target material deposited on the substrate 902 by adjusting an amount of the target material on the inclined traveling path deposited on the substrate 902 based on a configuration signal from the controller 300. In the illustrated embodiment shown in FIG. 2, the smart collimator 500 is coupled to the process shield 910 using four coupling locations 508. In some embodiments, the coupling locations 508 include the ultrasonic vibration generating units 950. In some embodiments, the smart collimator 500 is couple to the process shield 910 using less than four coupling locations 508 or more than four coupling locations 508.

FIG. 3 is a cross-sectional view (I-I') of the smart collimator 500 according to one or more embodiments in the present disclosure.

Referring to FIG. 2 and FIG. 3, the smart collimator 500 includes the microchannels 940 that are embedded in the side walls surrounding the narrow passages of the smart collimator 500, scrubbing gas outlets 942 where the scrubbing gas is released for cleaning the hollow structures 502 by removing the accumulated target material, and the ultrasonic vibration generating units 950 embedded in the side walls surrounding the narrow passages of the smart collimator 500 for cleaning the hollow structures 502 by removing accumulated target material.

As illustrated in FIG. 3, the microchannels 940 are integrated into the side walls that form the openings 504 and serve as gas lines connecting between the scrubbing gas receiving port 930 and the scrubbing gas outlets 942 in some embodiments of the present disclosure. Any suitable gas can be used to remove the accumulated target material. In some embodiments, chemically inactive gas is used as the scrubbing gas. In some embodiments, nitrogen ($N_2$) is used as the scrubbing gas. In some embodiments of the present disclosure, the microchannels 940 are not embedded into the side walls. As a non-limiting example, the microchannels 940 (e.g., micro gas lines) are separated from the side walls but surrounded by the inner side of the narrow passages.

As illustrated in FIG. 3, the ultrasonic vibration generating units 950 are integrated into the side walls that form the openings 504. Any suitable ultrasonic vibration generating units 950 that can serve as electro-mechanical converters are used to generate ultrasonic vibration at 20 kHz frequency or above. In some embodiments, the ultrasonic vibration generating units 950 include transducers based on at least one piezoelectric material. In some embodiments, the ultrasonic vibration generating units 950 include transducers based on at least one magnetic material or any other suitable materials that can generate appropriate magnitude of vibration that can be used for removing accumulated target material from the hollow structures 502. In some embodiments, the ultrasonic vibration generating units 950 are not embedded into the side walls but installed or mounted on any suitable locations such as the coupling locations 508. In some embodiments, the ultrasonic vibration generating units 950 generate vibration below 20 kHz.

Referring to FIGS. 1, 2, and 3, the smart collimator 500 includes the plurality of hollow structures 502 configured to receive the scrubbing gas and to direct (or channel) the scrubbing gas to where the material from target 204 is accumulated (e.g., the inner side surfaces of the hollow structures 502). In various embodiments, the smart collimator 500 includes the ultrasonic vibration generating units 950 that generate vibration to remove the accumulated target material. In various embodiments of the present disclosure, the plurality of hollow structures 502 is clustered to provide a plurality of openings 504 where the material from the target 204 passes through. In other words, the hollow structures 502 provide narrow passages between the target 204 and the substrate 902. Based on the length of the narrow passages, the likelihood of filling gap patterns with a high aspect ratio on the substrate 902 changes. For example, the passages with a longer length provide a better result for filling the gaps with the high aspect ratio. The amount of the material deposited on the substrate 902 changes based on the length of the narrow passages. For example, the passages with a shorter length allow more material from the target 204 to deposit on the substrate 902. In some embodiments of the present disclosure, the smart collimator 500 includes the coupling locations 508 that are used to attach the smart collimator 500 to the inner side of the process shield 910. In the illustrated embodiment in FIG. 2, the coupling locations 508 include the scrubbing gas receiving port 930 in various embodiments of the present disclosure. In some embodiments, the coupling locations 508 include the ultrasonic vibration generating units 950 which are configured to apply the vibration to the hollow structures 502.

Figure 4:
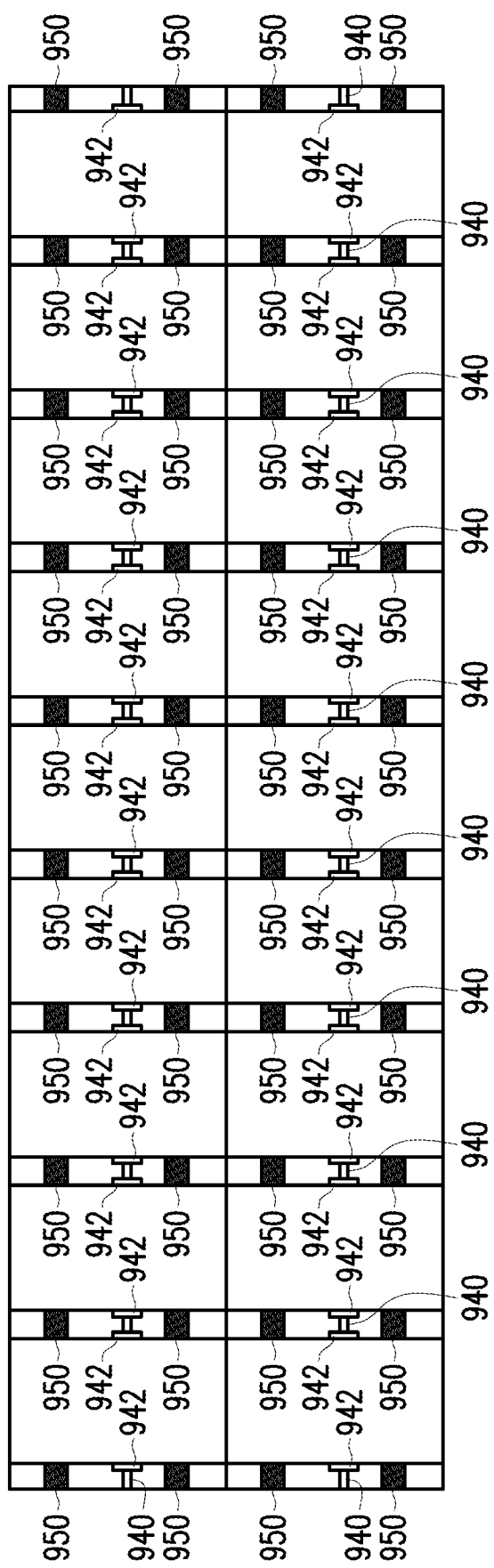
FIG. 4 is a cross-sectional view of two collimators that are stacked together according to one or more embodiments in the present disclosure.

FIG. 4 is a cross-sectional view of two smart collimators 500 stacked together according to one or more embodiments in the present disclosure.

Referring to FIG. 4, the smart collimator 500 can be stacked on or over another smart collimator 500 to adjust a total length of the hollow structures 502 (e.g., narrow passages) through which the target material passes before impinging on the substrate 902. As discussed above, the passages with a longer length provide a better result for filling the gap with the high aspect ratio on the substrate 902. Accordingly, in some embodiments, a fabrication operator can adjust the length by stacking one or more smart collimators 500 to improve the capability of filling the gap with the high aspect ratio on the substrate 902. As discussed above, the passages with a shorter length allow more material from the target 204 to deposit on the substrate 902. Accordingly, in some embodiments, the fabrication operator can adjust the length by removing one or more smart collimators 500 to increase the amount of target material deposited on the substrate 902.

Referring to FIGS. 1, 2, 3, and 4, each of the smart collimators 500 includes the microchannels 940 for distributing the scrubbing gas, the scrubbing gas outlets 942 where the scrubbing gas is released for removing the accumulated target material from the hollow structures 502 (e.g., inner sides surrounding the openings 504), and the ultrasonic vibration generating units 950 for removing the accumulated deposited material in the hollow structures 502 (e.g., inner sides surrounding the openings 504). In some embodiments, the amount of scrubbing gas supplied to the microchannels 940 is regulated based on the scrubbing gas signal from a controller 300. In some embodiments, the vibration generated at each of the ultrasonic vibration generating units is controlled by the vibration control signal transmitted from the controller 300.

Figure 5:
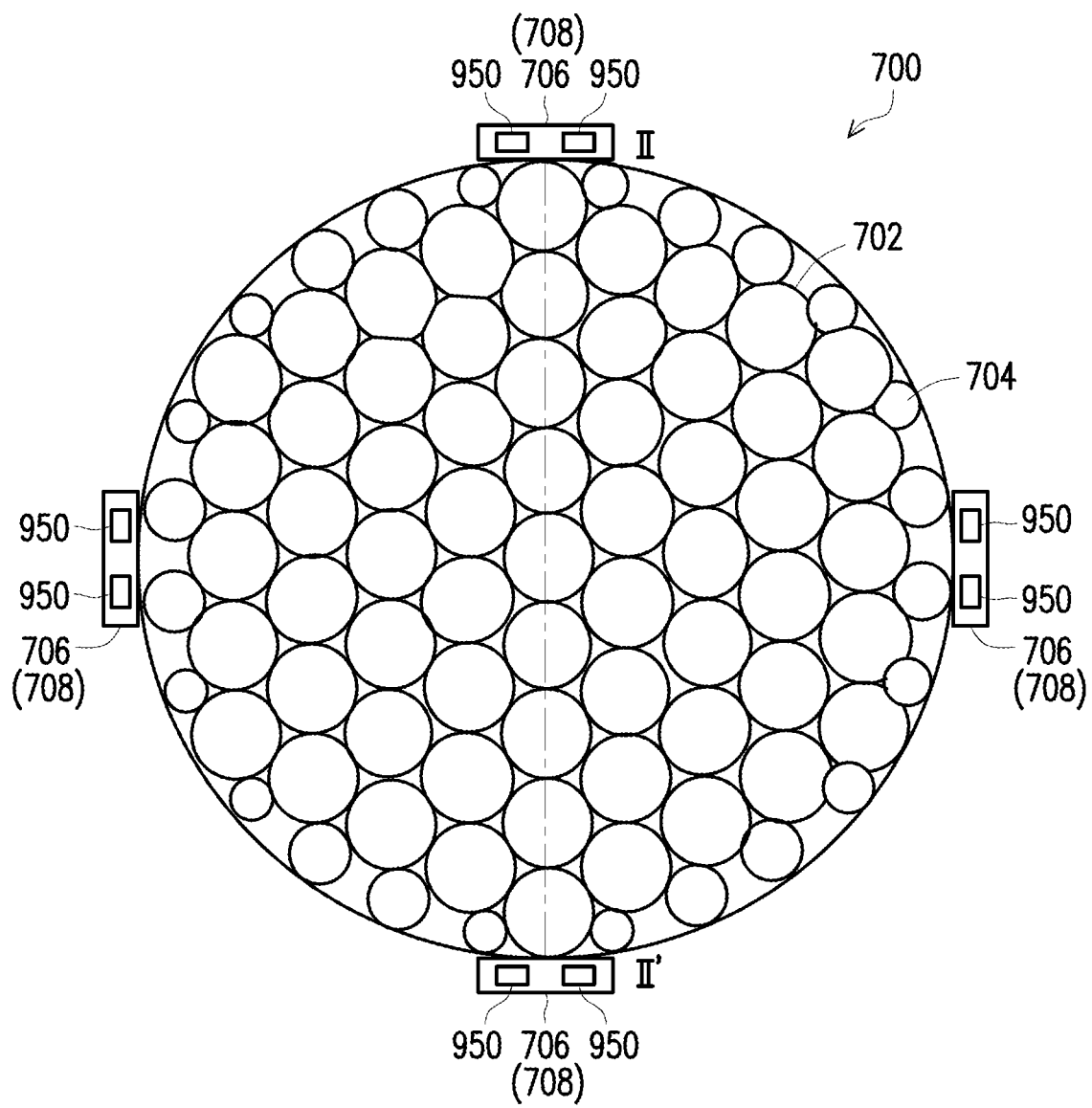
FIG. 5 is a top view of a flux adjusting member according to one or more embodiments in the present disclosure.
Figure 6:
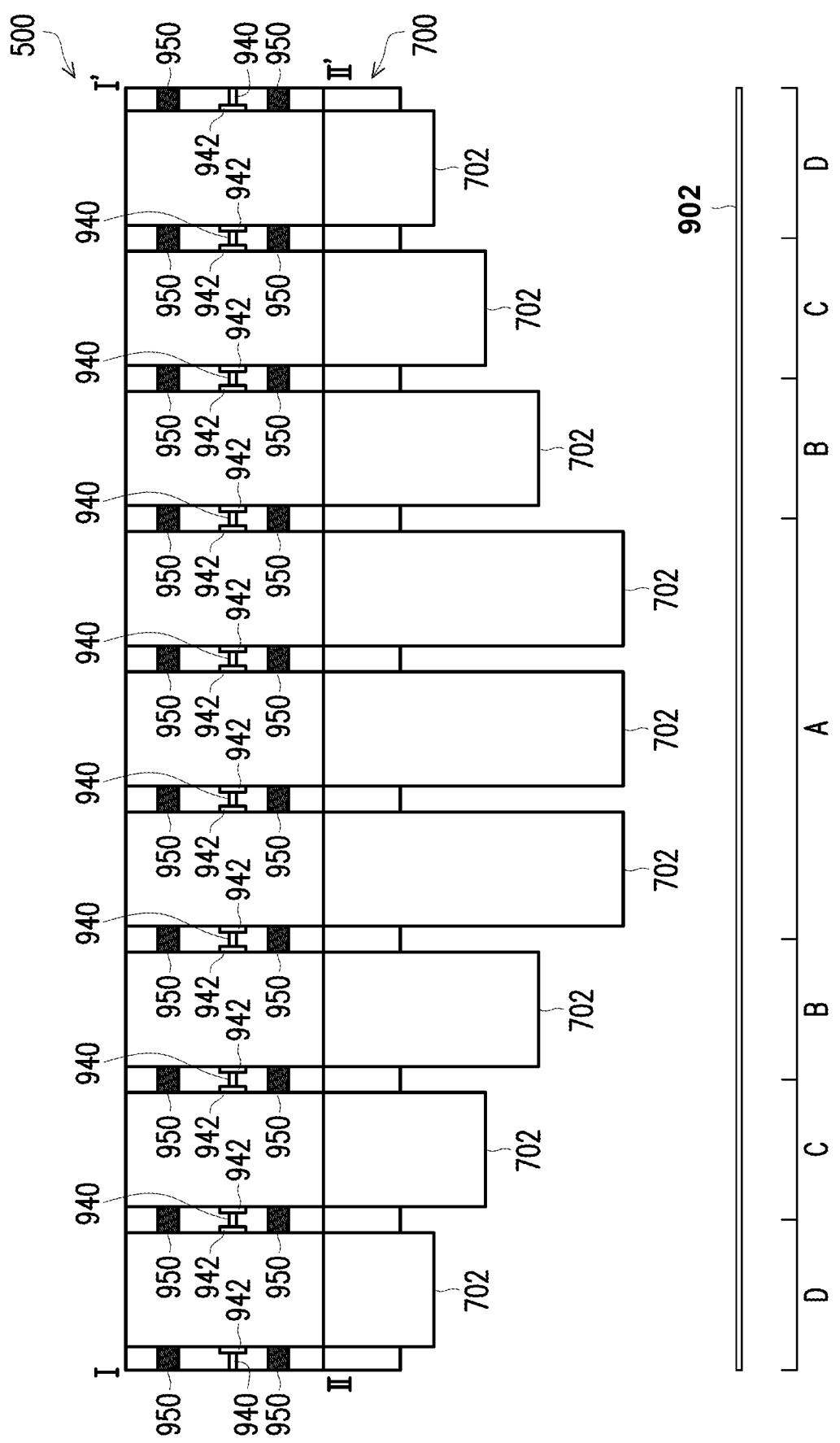
FIG. 6 is a cross-sectional view of the collimator along with a cross-sectional view of the flux adjusting member according to one or more embodiments in the present disclosure.

FIG. 5 is a top view of the flux adjusting member 700 according to one or more embodiments in the present disclosure. FIG. 6 is a cross-sectional view of the smart collimator 500 (I-I') along with a cross-sectional view of the flex adjusting member 700 (II-II') according to one or more embodiments of the present disclosure.

Referring to FIG. 5 and FIG. 6, the flux adjusting member 700 includes a plurality of adjustable hollow structures 702 configured to adjust a respective length for each of the adjustable hollow structures 702 based on a configuration control signal from a controller 300 (e.g., extend or retract to a determined length). In various embodiments of the present disclosure, the plurality of adjustable hollow structures 702 is clustered to provide a plurality of openings 704 where the material from the target 204 passes through. In other words, the adjustable hollow structures 702 provide narrow passages between the target 204 and the substrate 902. In some embodiments, each of the adjustable hollow structures 702 overlaps a portion of the underlying substrate 902. A length for each of the narrow passages (adjustable hollow structure 702) effect a corresponding area on the substrate 902 at which the target material is directed. For example, by extending one of the adjustable hollow structures 702, target material is directed at a corresponding surface area of the substrate 902 with less target material traveling in an inclined direction, accordingly, a gap with a high aspect ratio on the corresponding area on the substrate 902 is likely to fill without having void or overhang issues. In addition, by retracting one of the adjustable hollow structures 702, target material including more target material traveling in an inclined direction is deposited on the corresponding area on the substrate 902. In various embodiments, to increase the amount of the material from the target 204 that passes through the openings 704, the plurality of openings 704 includes the openings 704 in various sizes. In some embodiments of the present disclosure, the flux adjusting member 700 includes a coupling mechanism 706 that is used to attach the flux adjusting member 700 to the inner side of the process shield 910. In the illustrated embodiment shown in FIG. 5, the flux adjusting member 700 is coupled to the process shield 910 using four screw coupling locations 708. In some embodiments, the coupling mechanism 706 includes the ultrasonic vibration generating units 950.

Referring to FIG. 6, the smart collimator 500 includes the flux adjusting member 700 in some embodiments of the present disclosure. As illustrated in FIG. 6, the flux adjusting member 700 is disposed on the bottom side of the smart collimator 500 in some embodiments. In various embodiments, each of the adjustable hollow structures 702 in the flux adjusting member 700 is adjusted based on the configuration control signal from the controller 300. Based on the configuration control signal from the controller 300, the respective length for each of the adjustable hollow structures 702 can be adjusted.

In the illustrated embodiment shown in FIG. 6, the openings 504 of the smart collimator 500 and the openings 704 of the flux adjusting member 700 are corresponding to each other, i.e., they are aligned with each other and the concentric with each other.

In the illustrated embodiment shown in FIG. 6, the respective length for each of the adjustable hollow structures 702 is adjusted such that the adjustable hollow structures 702 at location A are longer than the adjustable hollow structures 702 at locations B, C, and D. In the illustrated embodiment, the adjustable hollow structures 702 at location B are longer than the adjustable hollow structures 702 at locations C and D. The adjustable hollow structures 702 at location C are longer than the adjustable hollow structures 702 at location D in the illustrated embodiment.

In the illustrated embodiment, the length for each of the adjustable hollow structures 702 is incrementally changed based on the configuration control signal from the controller 300. However, the present disclosure does not limit that the length of the adjustable hollow structures 702 changes incrementally. In various embodiments, each of the hollow adjustable structures 702 is retracted or extended to a determined length.

Flux adjusting member 700 configured as illustrated in FIG. 6 provides a greater step coverage for a high aspect ratio gap at the center of the substrate 902 (corresponding to location A) than a step coverage for a high aspect ratio gap at the periphery area of the substrate 902 (corresponding to locations B, C, and D) since the hollow structures 502 and the adjustable hollow structures 702 at the location A of the smart collimator 500 capture or block more target material that is likely to deposit on the side wall of the gap. However, the flux adjusting member 700 configured as illustrated in FIG. 6 provides a higher deposition rate at the periphery area of the substrate 902 (corresponding to locations B, C, and D) than the center area of the substrate 902 (corresponding to location A) since less material is blocked or captured at locations B, C, and D of the flux adjusting member 700 (e.g., periphery area of the smart collimator 500). In other words, the respective length for each of the adjustable hollow structures 702 in the flux adjusting member 700 can be adjusted based on a size of the gap aspect ratio, a target uniformity of the thin film 904 on the substrate 902, and/or an amount of target material planning to deposit on each of the corresponding areas on the substrate 902.

The embodiment illustrated in FIG. 1 illustrates that the substrate pedestal 202 is in a process position (e.g., upper position) supporting the substrate 902 during a sputtering process. At this time, the thin film 904 is formed with the target material from the target 204 (and reactive gas supplied to the substrate process chamber 200) on the substrate 902. In various embodiments, the smart collimator 500 (equipped with the flux adjusting member 700) is capable of adjusting the respective length for each of the adjustable hollow structures 702 (e.g., extend or retract to a determined length) based on the thickness measurements collected from the substrate 902 at a plurality of locations after the deposition at the substrate process chamber 200 is completed.

As discussed above, in various embodiments of the present disclosure, the flux adjusting member 700 included in the smart collimator 500 is capable of adjusting the respective length for each of the adjustable hollow structures 702 to provide the uniform deposition rate at all locations on subsequent substrates. For example, at least one of the adjustable hollow structures 702 can be extended to reduce the deposition rate (e.g., amount of the target material) at a corresponding location (e.g., where the substrate process chamber 200 deposited excessive amount of material on the substrate 902) for the subsequence substrates. In addition, at least one of the adjustable hollow structures 702 can be retracted to increase the deposition rate (amount of the deposited material) at a corresponding location (e.g., where the substrate process chamber 200 previously deposited less amount of material on the substrate 902) on the subsequent substrates. By increasing and/or decreasing the deposition rates at different corresponding locations on the subsequent substrates, the substrate process chamber 200 can provide uniform deposition on the subsequent substrates.

Referring to FIGS. 1 and 6, FIG. 6 illustrates the flux adjusting member 700 configured for the subsequent substrates for uniform deposition after thickness measurement (e.g., uniformity measurement) is completed on the thin film 904 illustrated in FIG. 1. Based on the thickness measurement, a respective length for each of the adjustable hollow structures 702 is determined. As discussed above, the adjustable hollow structures 702 can be extended to reduce the deposition rate (e.g., amount of the target material) at a corresponding location (center area for this case), and the adjustable hollow structures 702 can be retracted to increase the deposition rate (amount of the deposited material) at a corresponding location (wafer edge area for this case).

By adjusting the respective length for one or more of the adjustable hollow structures 702 in the flux adjusting member 700, less target material is deposited on the flux adjusting member 700 that can reduce the production yield (e.g., chamber particle issue due to particles peeled from a collimator). In addition, by adjusting the respective length for one or more of the adjustable hollow structures 702 in the flux adjusting member 700, more target material is actually utilized for deposition.

As discussed above, in various embodiments, the flux adjusting member 700 is capable of adjusting the respective length for each of the adjustable hollow structures 702 to improve step coverage for filling the high aspect ratio gap in the patterns on the substrate 902. For example, the adjustable hollow structures 702 in the flux adjusting member 700 can be extended collectively to improve the step coverage for the high aspect ratio gap in the patterns on the substrate 902. As indicated above, by extending the adjustable hollow structures 702, the deposition rate of the substrate process chamber 200 is reduced. So, the adjustable hollow structures 702 in the flux adjusting member 700 can be retracted collectively to a certain length for filling low aspect ratio gap in the patterns on the substrate 902 to maintain a certain deposition rate for production throughput.

Again, by adjusting the respective length for one or more of the adjustable hollow structures 702 in the flux adjusting member 700, less target material is deposited on the flux adjusting member 700 that can reduce the production yield (e.g., chamber particle issue due to particles peeled from the collimator). In addition, by adjusting the respective length for one or more of the adjustable hollow structures 702 in the flux adjusting member 700, more target material is actually utilized for deposition.

As discussed above, in various embodiments, the flux adjusting member 700 is capable of adjusting the respective length for each of the adjustable hollow structures 702 to stabilize the deposit rate to maintain uniform deposition for all areas on the substrate 902. For example, the adjustable hollow structures 702 can be extended or retracted to stabilize the deposition rate based on the target erosion profile. By retracting (or maintaining) the length of the adjustable hollow structures 702 corresponding to locations where less target material remains on the target 204 (which leads to less materials exiting from the target surface), and by extending the length of the adjustable hollow structures 702 corresponding to locations where more target material remains on the target 204 (which leads more material exiting the target surface), the substrate process chamber 200 can maintain the deposition rate while maintaining the uniformity of the layer deposited in the substrate process chamber 200.

Again, by adjusting the respective length for one or more of the adjustable hollow structures 702 in the flux adjusting member 700, less target material is deposited on the flux adjusting member 700 that can reduce the production yield (e.g., chamber particle issue due to particles peeled from a collimator). In addition, by adjusting the respective length for one or more of the adjustable hollow structures 702 in the flux adjusting member 700, more target material is utilized for deposition.

As discussed above, the smart collimator 500 is configured to apply the scrubbing gas to remove the accumulated target material from the smart collimator 500 in some embodiments of the present disclosure. In some embodiments, the smart collimator 500 is configured to apply (ultrasonic) vibration to shake off the accumulated target material from the smart collimator 500. In some embodiments, the scrubbing gas and/or vibration is applied to the smart collimator 500 based on predetermined cleaning frequency. For non-limiting example, in some embodiments, the scrubbing gas and/or vibration is applied based on power on time of the substrate process chamber 200. In some embodiments, the scrubbing gas and/or vibration is applied based on a plasma on time of the substrate process chamber 200. In some embodiments, the scrubbing gas and/or vibration is applied based on periodic interval of wafer counts. In some embodiments, the scrubbing gas and/or vibration is applied based on the lifetime of the smart collimator 500. In some embodiments, a cleaning recipe that includes one or more cleaning steps (e.g., scrubbing gas cleaning step and vibration cleaning step) is used to clean the smart collimator 500.

Controller 300 controls scrubbing gas supplied to the hollow structures 502 (and the adjustable hollow structure 702) based on flow rate (e.g., standard cubic centimeters per minute) and flow time by transmitting the scrubbing gas control signal to the mass flow controller (MFC) 960. In some embodiments, the controller 300 controls vibration time, magnitude of vibration and/or waveform of vibration for each of the ultrasonic vibration generating units 950 by transmitting the vibration control signal to the vibration driver 970.

In some embodiments of the present disclosure, the controller 300 runs a smart collimator cleaning recipe which includes the scrubbing gas cleaning step that transmits the scrubbing gas control signal from the controller 300 to the mass flow controller 960. In some embodiments, the controller 300 runs the cleaning recipe which includes the vibration cleaning step that transmits the vibration control signal from the controller 300 to the vibration driver 970. In some embodiments, the controller 300 runs the cleaning recipe which includes both the gas scrubbing cleaning step and the vibration cleaning step.

In accordance with one or more embodiments, the controller 300 includes an input circuitry 302, a memory 304, a processor 306, and an output circuitry 308. See FIG. 1. Controller 300 includes the (computer) processor 306 configured to perform the various functions and operations described herein including receiving input data from various data sources (e.g., automated material handling system (AMHS) and measurement devices such as metrology tools) via the input circuitry 302 and transmitting output data (e.g., scrubbing gas control signal and vibration control signal) to components in the substrate process chamber 200 (e.g., vibration driver 970 and mass flow controller 960) that regulate the scrubbing gas flow and/or ultrasonic vibration for removing the accumulated target material in the smart collimator 500.

In various embodiments, the controller 300 transmits the scrubbing gas control signal and/or vibration control signal based on deposition uniformity data received from measurement devices such as the metrology tool capable of measuring thickness and thickness uniformity of films deposited on the substrate. In some embodiments, after the deposition process is completed on the substrate 902 at the substrate process chamber 200, uniformity of thin film 904 deposited on the substrate 902 is measured by the metrology tool.

In various embodiments, when the controller 300 determines that the thin film 904 deposited on the substrate 902 has a uniformity that is equal to or below the predetermined uniformity threshold value, the controller 300 transmits the scrubbing gas control signal and/or vibration control signal. In some embodiments, the controller 300 transmits the scrubbing gas control signal to the mass flow controller 960 to remove the accumulated target material that is deposited on the narrow passages in the hollow structures 502. In some embodiments, the controller 300 transmits the vibration control signal to the vibration driver 970 that controls the ultrasonic vibration generating units 950. Ultrasonic vibration generating units 950 are used to shake off the accumulated target material from the narrow passages in the hollow structures 502. In various embodiments, the controller 300 transmits the scrubbing gas control signal and the vibration control signal together to remove the accumulated target material from the narrow passage in the hollow structures 502.

In some embodiments, the controller 300 transmits the configuration control signal to the flux adjusting member driver 980 connected to the flux adjusting member 700 during the cleaning procedure (e.g., applying the ultrasonic vibration and the scrubbing gas) so the adjustable hollow structures 702 are in a proper clean position. For non-limiting example, the smart collimator 500 is configured such that the adjustable hollow structures 702 extend to a cleaning length (e.g., maximum length) so the inner sides of the adjustable hollow structures 702 can be cleaned by the scrubbing gas and/or the vibration. In some embodiments, the smart collimator 500 is configured such that the adjustable hollow structures 702 are extended and retracted repeatedly for a predetermined duration to effectively remove the accumulated target material. In some embodiments, this extend and retract movement creates vibration that can be utilized for cleaning the smart collimator 500.

In various embodiments, the controller 300 transmits the scrubbing gas control signal and/or vibration control signal based on a predetermined cleaning frequency. For non-limiting example, in some embodiments, the controller 300 transmits the scrubbing gas control signal and/or vibration control signal based on periodic intervals of substrate process chamber power on time. In some embodiments, the controller 300 transmits the scrubbing gas control signal and/or vibration control signal based on periodic intervals of plasma on time in the substrate process chamber 200. In some embodiments, the controller 300 transmits the scrubbing gas control signal and/or vibration control signal based on periodic intervals of wafer counts. In some embodiments, the controller 300 transmits the scrubbing gas control signal and/or vibration control signal based on periodic intervals of the lifetime of the smart collimator 500. In some embodiments, the controller 300 transmits the scrubbing gas control signal and/or vibration control signal based on the condition of the substrate process chamber 200. In some embodiments, the controller 300 transmits the scrubbing gas control signal and/or vibration control signal based on two more conditions listed above.

As discussed above, the controller 300 transmits the scrubbing gas control signal and/or vibration control signal based on the condition of the substrate process chamber 200 in some embodiments. For non-limiting example, before running a lot of substrates 902 in a front opening unified pod (FOUP), one or more particle check wafers (mechanical dummy wafers) are cycled through the substrate process chamber 200. Based on the particle count result measured from the particle check wafers, the controller 300 determines the condition of the substrate process chamber 200. If the controller 300 determines that the particle count is equal to or more than the predetermined value, the controller 300 transmits the scrubbing gas control signal and/or vibration control signal.

Memory 304 stores information received via the input circuitry 302 and the processed data from the processor 306. Memory 304 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like. Output circuitry 308 transmits the vibration control signal and/or scrubbing gas control signal.

In some embodiments, the processor 306 includes an artificial intelligence controller 307 that includes a cleaning timing controller 312 and a cleaning recipe generator 314. Cleaning timing controller 312 is used to determine and/or predict proper timing for running the cleaning recipe for cleaning the smart collimator 500 by employing one or more artificial intelligence techniques. Cleaning recipe generator 314 is used to generate and/or modify the cleaning recipe by employing one or more artificial intelligence techniques.

"Artificial intelligence" is used herein to broadly describe any computationally intelligent systems and methods that can learn knowledge (e.g., based on training data), and use such learned knowledge to adapt their approaches for solving one or more problems, for example, by making inferences based on a received input such as measurements (e.g., particle measurement data and uniformity data) received via the input circuitry 302. Artificially intelligent machines may employ, for example, neural network, deep learning, convolutional neural network, Bayesian program learning, and pattern recognition techniques to solve problems such as determining the timing for running the cleaning recipe for cleaning the smart collimator 500. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the cleaning timing controller 312 may learn to determine and/or predict the proper timing for running the cleaning recipe.

In some embodiments, the cleaning timing controller 312 is trained based on training data 303 stored in the memory 304. In some embodiments, the training data 303 includes predetermined cleaning timings for various conditions. For non-limiting example, the training data 303 includes the predetermined cleaning timing for running the cleaning recipe corresponding to different conditions such as uniformity of deposited thin film 904, power on time of the substrate process chamber 200, plasma on time of the substrate process chamber 200, wafer counts, the lifetime of the smart collimator 500, and any combinations thereof.

In some embodiments, based on the training data 303, the cleaning timing controller 312 determines the proper timing for running the clean recipe that includes transmitting the scrubbing gas control signal and/or the vibration control signal.

In some embodiments, the cleaning timing controller 312 learns to modify its behavior in response to the training data 303 and obtain or generate cleaning timing knowledge which is stored in a cleaning timing database 305. The cleaning recipe timing knowledge includes result of operating the deposition system 100 using the training data 303 such as thin film uniformity and corresponding training data 303 used, condition of the substrate process chamber 200 (e.g., particle count) and corresponding training data 303 used, and fabrication yield and corresponding training data 303 used.

In some embodiments, based on the cleaning timing knowledge, the cleaning timing controller 312 makes corrections to the training data 303 to optimize or improve the training data 303 to a particular substrate process chamber 200 and/or smart collimator 500. In other words, the cleaning timing controller 312 continuously modifies its behavior in response to the training data 303 and the cleaning timing database 305 and updates the cleaning timing in the cleaning timing database 305.

As discussed above, "artificial intelligence" is used herein to broadly describe any computationally intelligent systems and methods that can learn knowledge (e.g., based on training data), and use such learned knowledge to adapt their approaches for solving one or more problems, for example, by making inferences based on a received input such as measurements (e.g., particle measurement data and uniformity data) received via the input circuitry 302. Artificially intelligent machines may employ, for example, neural network, deep learning, convolutional neural network, Bayesian program learning, and pattern recognition techniques to solve problems such as determining one or more cleaning steps included in the cleaning recipe. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the cleaning recipe generator 314 may learn to configure the cleaning recipe In some embodiments, the cleaning recipe generator 314 is trained based on training data 303 stored in the memory 304. In some embodiments, the training data 303 includes predetermined leaning recipes that are suitable to remove the target material deposit on the smart collimator 500 under various conditions. For non-limiting example, the training data 303 includes the predetermined cleaning recipes corresponding to different conditions such as uniformity of deposited thin film 904, power on time of the substrate process chamber 200, plasma on time of the substrate process chamber 200, wafer counts, the lifetime of the smart collimator 500, and any combinations thereof.

In some embodiments, based on the training data 303, the cleaning recipe generator 314 determines the proper cleaning recipe including at least one of the cleaning steps (e.g., applying the scrubbing gas and applying the vibration). In some embodiments, the cleaning recipe generator 314 determines cleaning duration for each of the cleaning steps (e.g., scrubbing gas and vibration) based on the conditions described below.

In some embodiments, the cleaning recipe generator 314 learns to modify its behavior in response to the training data 303 and obtain or generate cleaning recipe knowledge which is stored in a cleaning recipe database 318. The cleaning recipe timing knowledge includes result of operating the deposition system 100 using the training data 303 such as thin film uniformity and corresponding training data 303 used, condition of the substrate process chamber 200 (e.g., particle count) and corresponding training data 303 used, and/or fabrication yield and corresponding training data 303 used.

In some embodiments, based on the cleaning recipe knowledge, the cleaning recipe generator 314 makes corrections to the training data 303 to optimize or improve the training data 303 to a particular substrate process chamber 200 and/or smart collimator 500. In other words, the cleaning recipe generator 314 continuously modifies its behavior in response to the training data 303 and the cleaning recipe database 318 and updates the cleaning recipe in the cleaning recipe database 318.

In some embodiments, the controller 300 controls the respective length for each of the adjustable hollow structures 702 in the flux adjusting member 700 (e.g., extend and retract). As discussed above, in some embodiments, the controller 300 includes an input circuitry 302, a memory 304, a processor 306, and an output circuitry 308. In some embodiments, the controller 300 includes the (computer) processor 306 configured to perform the various functions and operations described herein including receiving input data from various data sources (e.g., measurement data from the thin film 904, measurement data from the target 204, and gap aspect ratio information from the AMHS) via the input circuitry 302 and transmitting output data (e.g., configuration control signal) to the flux adjusting member driver 980 via the output circuitry 308. Input circuitry 302 receives the thin film thickness measurement, aspect ratio measurement, and/or target erosion profile measurement measured by respective measurement devices.

In some embodiments of the present disclosure, the thin film thickness measurement is taken at one location or a plurality of (predetermined or random) locations on the substrate 902. In some embodiments, the input circuitry 302 also receives process specification information such as a target thin film thickness. Details of the input circuitry 302, memory 304, and output circuitry 308 will be provided later in the present disclosure.

In some embodiments, the processor 306 determines at least one area or location (e.g., center area, wafer edge area, and area between the center area and the wafer edge area) where the thickness of the thin film 904 is out of or within the process specification. Based on the determination, the processor 306 determines a precise length for each of the adjustable hollow structures 702 (or relevant adjustable hollow structures 702) in the flux adjusting member 700. In some embodiments, the processor 306 determines a precise length for each of the adjustable hollow structures 702 (or relevant adjustable hollow structures 702) in the flux adjusting member 700 based on the aspect ratio measurement. In some embodiments, the processor 306 determines a precise length for each of the adjustable hollow structures 702 (or relevant adjustable hollow structures 702) in the flux adjusting member 700 based on the target erosion profile measurement.

Memory 304 stores information received via the input circuitry 302 and the processed data such as the determined location (area) information from the processor 306. Memory 304 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like. Output circuitry 308 transmits the configuration control signal (e.g., extend or retract) for the flux adjusting member 700 based on the measurement data.

In some embodiments, the processor 306 includes a configuration generator (artificial intelligence controller) 316 that is used to determine the respective length for each of the adjustable hollow structures 702 by employing one or more artificial intelligence techniques.

"Artificial intelligence" is used herein to broadly describe any computationally intelligent systems and methods that can learn knowledge (e.g., based on training data), and use such learned knowledge to adapt their approaches for solving one or more problems, for example, by making inferences based on a received input such as measurements (e.g., target erosion measurement data, aspect ratio measurement data, and uniformity measurement data) received via the input circuitry 302. Artificially intelligent machines may employ, for example, neural network, deep learning, convolutional neural network, Bayesian program learning, and pattern recognition techniques to solve problems such as determining the respective length for each of the adjustable hollow structures 702. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the configuration generator 316 may learn to determine the respective length for each of the adjustable hollow structures 702 (or relevant adjustable hollow structures 702) in the flux adjusting member 700.

In some embodiments, the configuration generator 316 is trained based on training data 303 stored in the memory 304. In some embodiments, the training data 303 includes predetermined lengths for the adjustable hollow structure 702 for various conditions. For a non-limiting example, the training data 303 includes the predetermined length for each of the adjustable hollow structures 702 corresponding to different target 204 thickness, different aspect ratios of gap, different thin film 904 thickness, and any combinations thereof.

In some embodiments, based on the training data 303, the configuration generator 316 controls and/or adjusts the respective length for each of the adjustable hollow structures 702 (or relevant adjustable hollow structures 702).

In some embodiments, the configuration generator 316 learns to modify its behavior in response to the training data 303 and obtain or generate configuration knowledge which is stored in a configuration database 320. The configuration knowledge includes result of operating the deposition system 100 using the training data 303 such as thin film uniformity and corresponding training data 303 used, fabrication yield for gap fill process and corresponding training data 303 used, and target life-time and corresponding training data 303 used.

In some embodiments, based on the configuration knowledge, the configuration generator 316 makes corrections to the training data 303 to optimize or improve the training data 303 to a particular substrate process chamber 200. In other words, the configuration generator 316 continuously modifies its behavior in response to the training data 303 and the configuration database 320 and updates the configuration knowledge in the configuration database 320.

Figure 7:
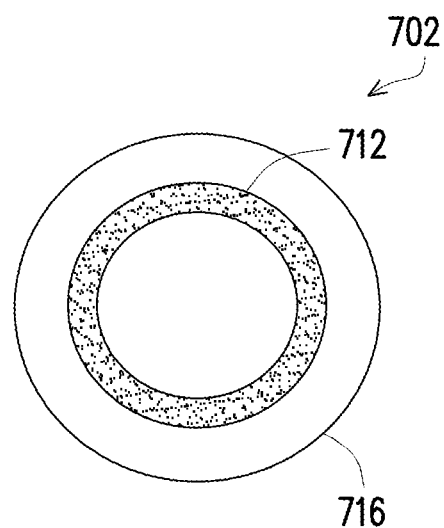
FIG. 7 is a top view of one adjustable hollow structure in the flux adjusting member according to one or more embodiments in the present disclosure.

FIG. 7 is a top view of one adjustable hollow structure 702 in the flux adjusting member 700 according to one or more embodiments in the present disclosure.

Figure 8:
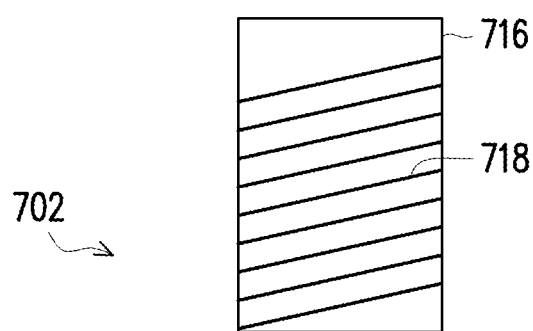
FIG. 8 is a side exploded view of one adjustable hollow structure in the flux adjusting member according to one or more embodiments in the present disclosure.
Figure 8:
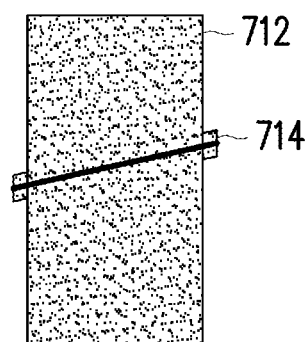

FIG. 8 is a side exploded view of one adjustable hollow structure 702 in the flux adjusting member 700 according to one or more embodiments in the present disclosure.

Figure 9:
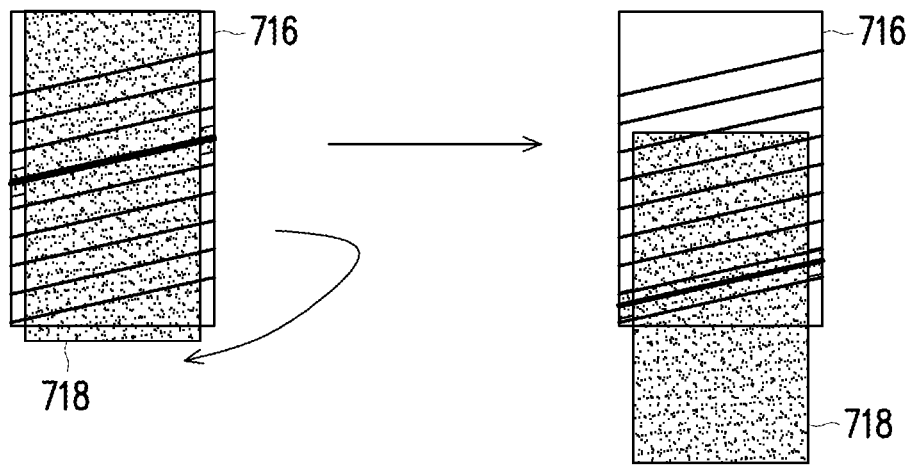
FIGS. 9 and 10 are side views of one adjusting hollow structure according to one or more embodiments in the present disclosure.
Figure 10:
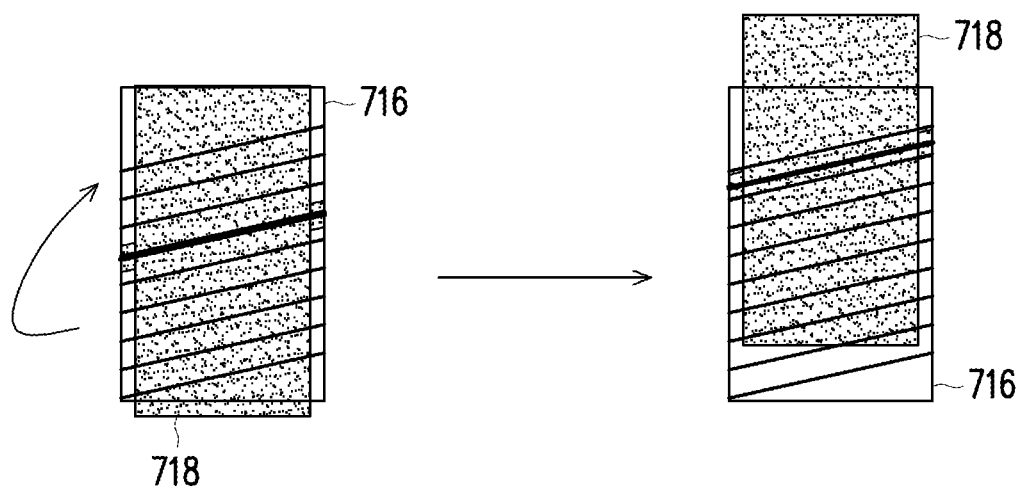

FIGS. 9 and 10 are side views of one adjustable hollow structure 702 in the flux adjusting member 700 according to one or more embodiments in the present disclosure.

Referring to FIGS. 7-10, the adjustable hollow structure 702 includes an inner hollow member 712 and an outer hollow member 716. In some embodiments, to adjust the length of the adjustable hollow structure 702, the inner hollow member 712 is configured to rotate in the outer hollow member 716. As the inner hollow member 712 is rotated in a first direction, the length of the adjustable hollow structure 702 becomes shorter. Similarly, as the inner hollow member 712 is rotated in a second direction, the length of the adjustable hollow structure 702 becomes longer.

In the illustrated embodiment shown in FIGS. 7-10, the outer hollow member 716 includes internal threads (helical grooves) 718, and the inner hollow member 712 includes a protrusion 714 (e.g., partial helical protrusion) that fits to the internal threads (helical grooves) 718 during the rotating movement.

In some embodiments, the length of the adjustable hollow structure 702 is adjusted by rotating the inner hollow member 712 using a motor (not shown) based on the configuration control signal from the controller 300. In some embodiments, the motor (now shown) is driven by a flux adjusting member driver 980 driven based on the configuration control signal from the controller 300.

Figure 11:
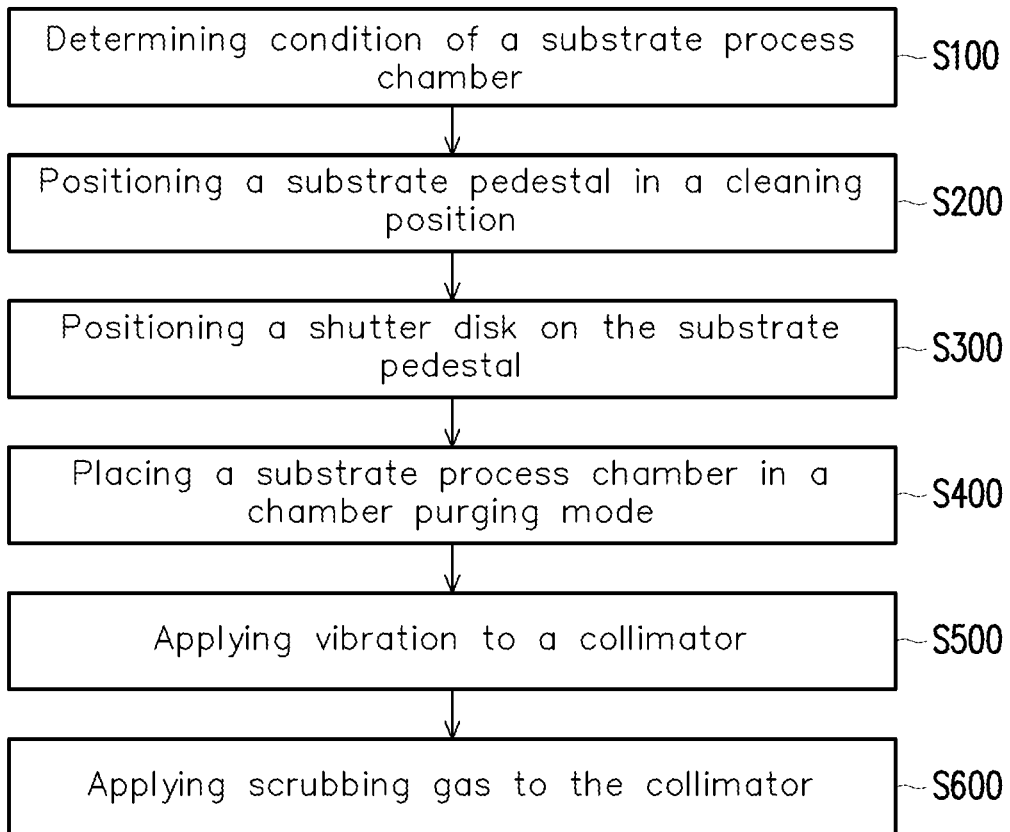
FIG. 11 is a flow chart illustrating a method of cleaning the collimator according to one or more embodiments in the present disclosure.

FIG. 11 is a flow chart illustrating a method of cleaning the smart collimator 500 according to various embodiments in the present disclosure.

Referring to FIG. 11, the method of cleaning the smart collimator 500 includes step S100 of determining the condition of the substrate process chamber 200, step S200 of positioning the substrate pedestal 202 in a cleaning position, step S300 of positioning the shutter disk (not shown) on the substrate pedestal 202, step S400 of placing the substrate process chamber 200 in a chamber purging mode, step S500 of applying the vibration to the smart collimator 500, and step S600 of applying the scrubbing gas to the smart collimator 500.

Step S100 of determining the condition of the substrate process chamber 200 includes a step of monitoring the condition of the substrate process chamber 200 and determining whether the condition of the substrate process chamber 200 is healthy based on the result from the monitoring.

In some embodiments of the present disclosure, the particle performance of the substrate process chamber 200 is monitored to determine the condition of the substrate process chamber 200. In non-limiting example, to measure the particle performance of substrate process chamber 200, a set of the mechanical dummy wafers can be cycled through the substrate process chamber 200. Based on the particle count result measured from the mechanical dummy wafers, the controller 300 determines the condition of the substrate process chamber 200. As discussed above, in some embodiments, if the controller 300 determines that the particle performance of the substrate process chamber 200 does not meet the particle standard in the predetermined fabrication specification, the controller 300 transmits the scrubbing gas control signal and/or vibration control signal.

In some embodiments of the present disclosure, the uniformity of the thin film 904 deposited on the substrate 902 is measured. Based on the uniformity resulted measured from the substrate 902, the controller 300 determines the condition of the substrate process chamber 200. As discussed above, in some embodiments, if the controller 300 determines that the uniformity of the thin film 904 does not meet the uniformity standard in the predetermined fabrication specification, the controller 300 transmits the scrubbing gas control signal and/or vibration control signal.

In some embodiments of the present disclosure, one or more operating conditions are monitored to determine the condition of the substrate process chamber 200 such as power on time of the substrate process chamber 200, plasma on time of the substrate process chamber 200, wafer counts from the last cleaning and/or replacement of the smart collimator 500, the lifetime of the smart collimator 500, and any combinations thereof. Based on the operating conditions, the controller 300 determines the condition of the substrate process chamber 200.

Step S200 of positioning the substrate pedestal 202 in the cleaning position includes positioning the substrate pedestal 202 in the cleaning positon (e.g., lower position) and removing the substrate 902 from the substrate pedestal 202.

Step S300 of positioning a shutter disk (not shown) on the substrate pedestal 202 includes covering the top surface of the substrate pedestal 202 with the shutter disk to prevent the target material deposited on the top surface of the substrate pedestal 202 from the smart collimator 500 during the smart collimator cleaning procedure.

Step S400 of placing the substrate process chamber 200 in the chamber purging mode includes having the substrate process chamber 200 in the chamber purging mode to purge out the target material that is removed from the smart collimator 500 during the smart collimator cleaning procedure in Step S500 and/or Step S600. In some embodiments, Step S400 and at least one of Step S500 or Step S600 are carried out simultaneously. In some embodiments, Step S400 is carried out earlier before Step S400 and at least one of Step S500 or Step S600 are carried out simultaneously. In some embodiments, Step S400 is carried out continuously after Step S400 and at least one of Step S500 or Step S600 are carried out simultaneously. In accordance with certain embodiments, Step S500 and S600 are carried out in series or simultaneously. (e.g., Step S500 and S600 are carried out in series in the chamber purging mode)

Step S500 of applying the vibration to the smart collimator 500 includes generating vibration from the ultrasonic vibration generating units 950. As discussed above, the ultrasonic vibration generating units 950 are integrated into the side walls that form the openings 504 in some embodiments of the present disclosure. In some embodiments, the ultrasonic vibration generating units 950 are integrated into the coupling locations 508. Any suitable ultrasonic vibration generating units 950 that can serve as electro-mechanical converters are used to generate ultrasonic vibration at 20 kHz frequency or above. In some embodiments, the ultrasonic vibration generating units 950 include transducers based on at least one piezoelectric material. In some embodiments, the ultrasonic vibration generating units 950 include transducers based on at least one magnetic material or any other suitable materials that can generate appropriate magnitude of vibration that can be used for cleaning. In some embodiments, the controller 300 controls vibration time, magnitude of vibration and/or waveform of vibration for each of the ultrasonic vibration generating units 950 by transmitting the vibration control signal to the vibration driver 970.

Step S600 of applying the scrubbing gas to the smart collimator 500 includes directing scrubbing gas to the inner sides of the passages in the smart collimator 500. As discussed above, in some embodiments, the controller 300 controls scrubbing gas supplied to the inner sides of the passages in the smart collimator 500 based on flow rate (e.g., standard cubic centimeters per minute) and flow time by transmitting the scrubbing gas control signal to the mass flow controller (MFC) 960. The type and amount of the scrubbing gas is chosen to promote removal of target material accumulated on the inner sides of the passages in the smart collimator 500. In accordance with certain embodiments, Step S500 and S600 are carried out in series or simultaneously. In some embodiments, Step S500 is carried out first when Step S500 and S600 are carried out in series. In some embodiments, Step S600 is carried out first when Step S500 and S600 are carried out in series.

As discussed above, the controller 300 determines the above steps using one or more artificial intelligence techniques.

Figure 12:
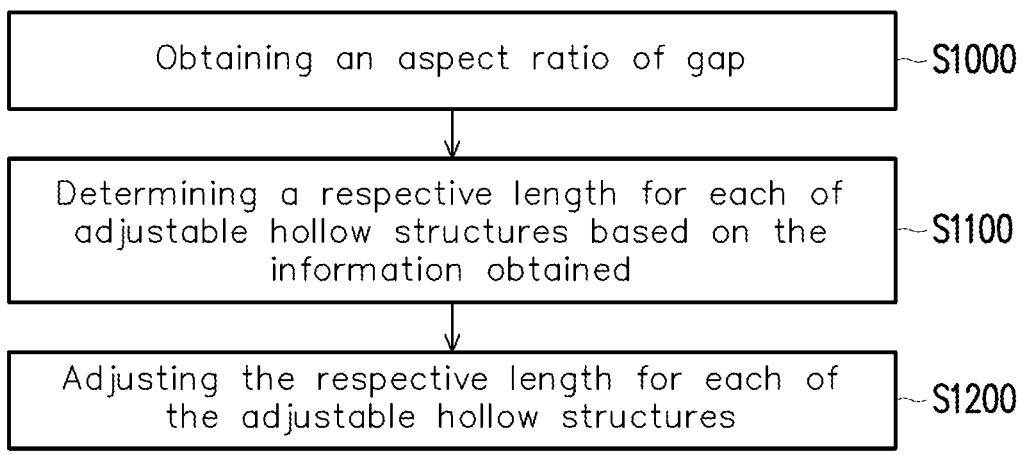
FIG. 12 is a flow chart illustrating a method of adjusting each of the adjustable hollow structures based on the aspect ratio of gap on the substrate according to one or more embodiments in the present disclosure.

FIG. 12 is a flow chart illustrating a method of adjusting each of the adjustable hollow structures 702 based on the aspect ratio of gap on the substrate 902 according to one or more embodiments in the present disclosure.

Referring to FIG. 12, the method of adjusting each of the adjustable hollow structure 702 includes step S1000 of obtaining the aspect ratio of gap on the substrate 902, step S1100 of determining the respective length for each of the adjustable hollow structure 702 based on the gap aspect ratio information obtained, and step S1200 of adjusting the respective length for each of the adjustable hollow structures 702 for the substrate 902.

Step S1000 of obtaining the aspect ratio of gap on the substrate 902 includes a step of obtaining the aspect ratio from the AMHS. In some embodiments, the controller 300 obtains the aspect ratio information based on process recipe running for the substrate 902. In some embodiments, the controller 300 receives the aspect ratio information from a metrology tool or measurement device located within the deposition system 100.

Step S1100 of determining the respective length for each of the adjustable hollow structures 702 based on the aspect ratio information includes a step of determining suitable length for each of the adjustable hollow structures 702 based on the aspect ratio information for the gap structures on the substrate 902. As discussed above, the controller 300 determines the respective length for each of the adjustable hollow structures 702 using one or more artificial intelligence techniques.

Step S1200 of adjusting the respective length for each of the adjustable hollow structures 702 for the substrate 902 includes a step of adjusting the respective length for each of the adjustable hollow structures 702 according to the determined suitable lengths. In some embodiments, the controller 300 transmits the configuration control signal to the flux adjusting member driver 980 to adjust the length for each of the adjustable hollow structures 702.

Utilizing the scrubbing gas and ultrasonic vibration for cleaning the smart collimator 500 will produce a substantial cost savings by improving the uniformity of the thin film 904 deposited in the substrate process chamber 200, particle performance of the substrate process chamber 200, and production throughput.

According to one or more embodiments of the present disclosure, a method of depositing a material from a target onto a substrate in a substrate process chamber includes determining a condition of the substrate process chamber. The method includes placing the substrate process chamber in a chamber purging mode. The method includes applying vibration to a collimator. The method further includes applying scrubbing gas to the smart collimator.

According to one or more embodiments of the present disclosure, a deposition system includes a substrate process chamber, a substrate pedestal in the substrate process chamber, the substrate pedestal configured to support a substrate, a target enclosing the substrate process chamber, a collimator having a plurality of hollow structures disposed between the target and the substrate; and a plurality of cleaning gas outlets within the collimator.

According to one or more embodiments of the present disclosure, a deposition system includes a collimator having a plurality of hollow structures disposed between a target and a substrate pedestal, at least one cleaning gas outlet within the collimator; and at least one vibration generating unit configured to provide vibration to the collimator, wherein cleaning gas released from the cleaning gas outlet and the vibration provided to the collimator are used to clean a surface of the collimator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of depositing a material from a target onto a substrate in a substrate process chamber, comprising:
   determining a condition of a substrate process chamber;
   placing the substrate process chamber in a chamber purging mode based on the condition of the substrate process chamber;
   applying vibration to a collimator in the substrate process chamber by applying the vibration to the collimator with one or more vibration generation units embedded within the collimator; and
   applying scrubbing gas to the collimator by introducing the scrubbing gas through one or more microchannels embedded within the collimator.

2. The method according to claim 1, wherein the one or more microchannels embedded within the collimator are along inner sides of one or more openings passing through the collimator.

3. The method according to claim 1, wherein the determining the condition of the substrate process chamber includes monitoring at least one of power on time of the substrate process chamber, plasma on time of the substrate process chamber, wafer counts from a last cleaning of the collimator, or lifetime of the collimator.

4. The method of claim 1, wherein applying the scrubbing gas further includes controlling an amount of the scrubbing gas released from one or more scrubbing outlets of the one or more microchannels with a controller and based on at least one artificial intelligence method.

5. The method of claim 1, wherein applying the vibration to the collimator in the substrate process chamber further includes controlling the one or more vibration generation units applied to the collimator in the substrate process chamber with a controller and based on at least one artificial intelligence method.

6. The method of claim 1, wherein:
   applying the scrubbing gas to the collimator further includes controlling an amount of the scrubbing gas released from one or more scrubbing gas outlets of the one or more microchannels with a controller and based on at least one artificial intelligence method, and
   applying the vibration to the collimator in the substrate process chamber further includes controlling the one or more vibration units with the controller and based on at least one artificial intelligence method.

7. The method of claim 1, wherein the condition of the substrate process chamber includes particle performance of the substrate process chamber.

8. The method of claim 7, further comprising determining a health status based on the particle performance of the substrate process chamber, the health status including a non-healthy status and a healthy status.

9. The method of claim 8, further comprising, transmitting one or more control signals output by a controller, wherein transmitting the one or more control signals output by the controller includes:
   a scrubbing gas control signal to initiate a process to apply the scrubbing gas to the collimator; and
   a vibration control signal to initiate a process to apply the vibration to the collimator in the substrate process chamber.

10. The method of claim 8, further comprising, transmitting one or more control signals output by a controller, wherein the transmitting the one or more control signals output by the controller includes at least one of:
   a scrubbing gas control signal to initiate a process to apply the scrubbing gas to the collimator; or
   a vibration control signal to initiate a process to apply the vibration to the collimator in the substrate process chamber.

11. A method, comprising:
   determining a condition of a substrate process chamber;
   based on the condition of the substrate process chamber, positioning a substrate pedestal in a cleaning position and placing the substrate process chamber in a chamber purging mode;
   after positioning the substrate pedestal in the cleaning position and placing the substrate process chamber in the chamber purging mode, applying vibration to a collimator within the substrate process chamber by activating one or more vibration generation units embedded within the collimator to vibrate the collimator; and
   after positioning the substrate pedestal in the cleaning position and placing the substrate process chamber in the chamber purging mode, applying a scrubbing gas to the collimator within the substrate process chamber by passing a scrubbing gas through one or more microchannels embedded within the collimator to introduce the scrubbing gas into one or more openings.

12. The method of claim 11, further comprising, when a substrate is present on the substrate pedestal, removing the substrate from the substrate pedestal.

13. The method of claim 12, further comprising, after removing the substrate previously present on the substrate pedestal, positioning a shutter disk on the substrate pedestal.

14. The method of claim 11, further comprising positioning a shutter disk on the substrate pedestal.

15. The method of claim 11, wherein the one or more scrubbing gas microchannels embedded within the collimator further includes one or more scrubbing gas outlets at and along one or more inner sides of one or more openings that pass through the collimator, and the scrubbing gas is introduced into the one or more openings by being ejected from the one or more scrubbing gas outlets.

16. The method of claim 11, wherein the determining the condition of the substrate process chamber includes monitoring at least one of power on time of the substrate process chamber, plasma on time of the substrate process chamber, wafer counts from a last cleaning of the collimator, or lifetime of the collimator.

17. A method, comprising:
   determining a condition of a substrate process chamber;
   placing the substrate process chamber in a chamber purging mode based on the condition of the substrate process chamber;
   applying vibration to a collimator in the substrate process chamber by activating one or more vibration generating units embedded within the collimator; and
   introducing a scrubbing gas into one or more openings of the collimator through one or more scrubbing gas outlets embedded within the collimator and in fluid communication with the one or more openings of the collimator and in fluid communication with one or more microchannels embedded within the collimator.

18. The method of claim 17, wherein applying the vibration to the collimator occurs before introducing the scrubbing gas.

19. The method of claim 17, wherein applying the vibration to the collimator occurs concurrently with introducing the scrubbing gas.

20. The method of claim 17, wherein the one or more vibration generation units are one or more ultrasonic vibration generation units.

* * * * *